(12) United States Patent
Ohtaki et al.

(10) Patent No.: US 6,335,866 B1
(45) Date of Patent: Jan. 1, 2002

(54) PRINTED WIRING BOARD UNIT FOR USE WITH ELECTRONIC APPARATUS

(75) Inventors: Tohru Ohtaki, Tokyo; Tohru Ohsaka, Yokohama, both of (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 09/167,576

(22) Filed: Oct. 7, 1998

(30) Foreign Application Priority Data

Oct. 9, 1997 (JP) ............................................ 9-277575

(51) Int. Cl.[7] ................................................. H05K 1/14
(52) U.S. Cl. ........................ 361/784; 361/803; 361/816; 174/250; 439/74
(58) Field of Search ................................ 361/760, 764, 361/767, 782, 783, 784, 785, 790, 791, 794, 803, 807, 800, 816; 174/254, 250; 439/74

(56) References Cited

U.S. PATENT DOCUMENTS

| | | | | |
|---|---|---|---|---|
| 4,200,900 A | * | 4/1980 | McGeorge | 361/803 |
| 5,583,749 A | * | 12/1996 | Tredennick et al. | 361/790 |
| 5,613,033 A | * | 3/1997 | Swamy et al. | 361/790 |
| 5,657,208 A | * | 8/1997 | Noe et al. | 361/790 |
| 5,663,871 A | * | 9/1997 | Bayani | 361/784 |
| 5,694,297 A | * | 12/1997 | Smith et al. | 361/785 |
| 5,856,915 A | * | 1/1999 | Weinberg | 361/790 |
| 5,933,343 A | * | 8/1999 | Lu et al. | 361/790 |
| 5,953,214 A | * | 9/1999 | Dranchak et al. | 361/767 |
| 6,014,320 A | * | 1/2000 | Mahon et al. | 361/803 |
| 6,049,467 A | * | 4/2000 | Tamarkin et al. | 361/790 |

FOREIGN PATENT DOCUMENTS

JP          6-314000        11/1994

* cited by examiner

*Primary Examiner*—Jayprakash N. Gandhi
(74) *Attorney, Agent, or Firm*—Fitzpatrick, Cella, Harper & Scinto

(57) ABSTRACT

A printed wiring board unit for use with an electronic apparatus in which the unit is formed by a power circuit and a digital circuit. The power circuit is constructed as a power circuit board made of a single-sided board, and the digital circuit is a high density digital circuit board which is smaller than the power circuit board. The digital circuit board is formed into a module by mounting thereon an IC, etc., which operates at the highest internal clock frequency. This reduced digital circuit board is mounted onto the power circuit board with spacing between parts in a layered structure, thereby improving unwanted radiation noise characteristics without increasing costs.

11 Claims, 4 Drawing Sheets

PRINTED WIRING BOARD UNIT FOR USE WITH ELECTRONIC APPARATUS

BACKGROUND OF THE INVENTION

1. Field of the Invention

The present invention relates to a printed wiring board unit for use with an electronic apparatus, in which measures are taken against unwanted radiation noise by mounting a second printed wiring board comprising a digital circuit onto a first printed wiring board which constitutes a power circuit.

2. Description of the Related Art

In general, an electronic apparatus comprises a power circuit section formed of mainly an analog circuit, and a control circuit section formed of mainly a digital circuit. The power circuit section is formed of large lead-type electronic parts which are circuits themselves, such as an AC/DC converter or a DC/DC converter. The control circuit section is formed of small surface-mounting-type electronic parts.

In recent years, electronic apparatuses have been getting faster, and the clock frequency in digital circuits is becoming increasingly higher. In response to this, countermeasures against unwanted radiation noise, which might cause a malfunction of other electronic apparatuses, are becoming difficult.

For this reason, conventionally, the digital circuit is formed on a printed wiring board separate from a power circuit, and power is supplied and signals are transmitted by using cables. FIG. 6 shows a top plan view of a conventional example in which a digital circuit and a power circuit are formed in separate printed wiring boards. In FIG. 6, a digital circuit is formed on a two-layer printed wiring board 9, and an IC, which is a CPU 3 operating at the highest internal clock frequency in the unit, a gate array IC 4 which controls the peripheral circuits of the CPU 3, and an IC of a dynamic memory 5 are mounted thereon. A printed wiring board 1 forming mainly a power circuit is normally made of a single-sided board, and 5-V power is supplied to the printed wiring board 9 through a connector 10 and a cable 11. Also, some digital signals are transmitted from the printed wiring board 9 to signal patterns of the printed wiring board 1 through the connector 10 and the cable 11. Bundled wires are also often used instead of the cable 11.

In the case of a mounting construction in which a power circuit board and a digital circuit board are separated, and power is supplied from the power circuit board to the digital circuit board through a cable in the manner described above, noise generated in the digital board is also transmitted to the cable and the cable becomes an antenna, generating high levels of unwanted radiation noise.

In contrast, an example in which a control circuit including a digital circuit and a power circuit are formed on the same printed wiring board is disclosed in Japanese Patent Laid-Open No. 6-314000. FIG. 7 shows a top plan view of a conventional example in which a digital circuit and a power circuit are formed on the same printed wiring board. With such a construction, since cables or bundled wires are not used, unwanted radiation noise can be considerably reduced to less than that in the former case.

In a normal case, a power circuit uses many large parts and since the pattern density may be low, an inexpensive board such as a single-sided board is used. However, in the case where a digital circuit pattern is formed on such a board, since it is difficult to form a digital ground which serves as a return path of a digital signal along the vicinity of a signal line with the shortest spacing, unwanted radiation noise is increased.

Therefore, no problem is posed when the number of digital signal lines is relatively small, a space is allowed, a ground can be appropriately wired, and the clock frequency is low. However, if the digital circuit section is complex and the number of wiring patterns become very large, it is difficult to wire a ground pattern. Furthermore, if the clock frequency is high, and because grounding is inherently more poor than that of two-layer and multi-layer boards, unwanted radiation noise characteristics become sharply deteriorated.

In order to prevent this, the single-sided board is replaced with a two-layer board or a multi-layer board, resulting in greatly increased costs. However, the power circuit part, which occupies most of the board, does not require such an expensive board.

In recent years, in digital circuits, the number of lines of the buses that the CPU processes has increased sharply. In response to this, the number of resistance parts which are inserted into the data bus and the address bus has also increased sharply. For example, the number of data bus lines which are connected to the CPU has increased from 8 to 16 to 32, and recently, 64 data bus lines are beginning to be most common. Various LSIs and memories, which operate at high speeds, are connected to such a CPU in order to control circuits peripheral to the CPU. Formation of such a complex digital circuit, a power circuit and an analog circuit, of which the latter two require only relatively simple patterns, causes either an increase in unwanted radiation noise or a greatly increased cost.

SUMMARY OF THE INVENTION

An object of the present invention, which has been achieved in view of the above-described circumstances, is to provide a printed wiring board unit for use with an electronic apparatus, in which a digital circuit board is mounted in a layered structure onto a power circuit board and unwanted radiation noise characteristics are improved without increasing the cost.

Another object of the present invention is to form a digital circuit board at a high density and a small size so as to mount it like other electronic components on a power circuit board.

The above and further objects, aspects and novel features of the invention will become more apparent from the following detailed description when read in connection with the accompanying drawings.

DESCRIPTION OF THE PREFERRED EMBODIMENTS

The preferred embodiments of the present invention are described below with reference to the accompanying drawings.

[First Embodiment]

Figure 1:
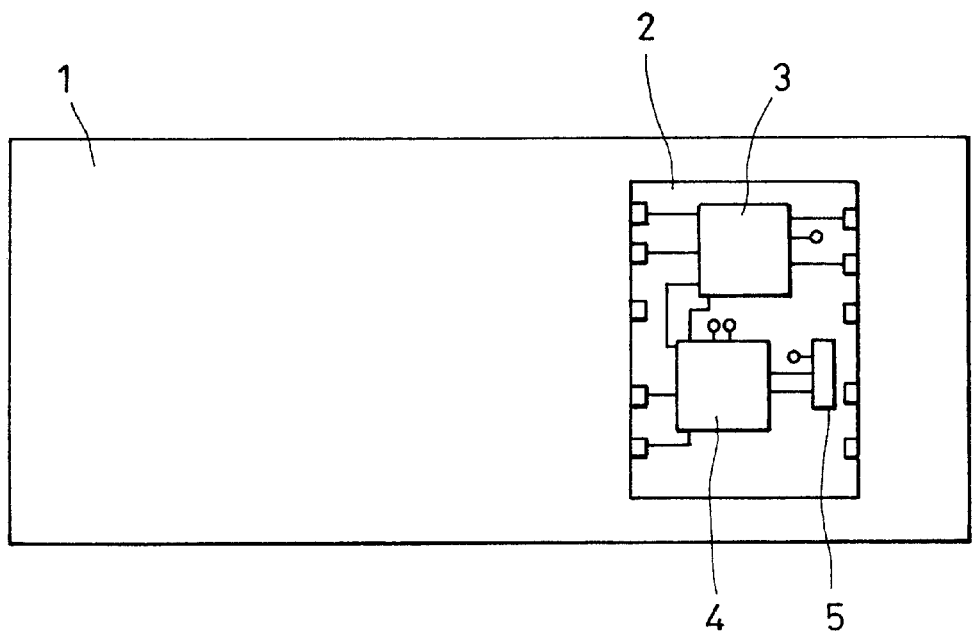
FIG. 1 is a top plan view of a printed wiring board unit according to a first embodiment of the present invention.
Figure 6:
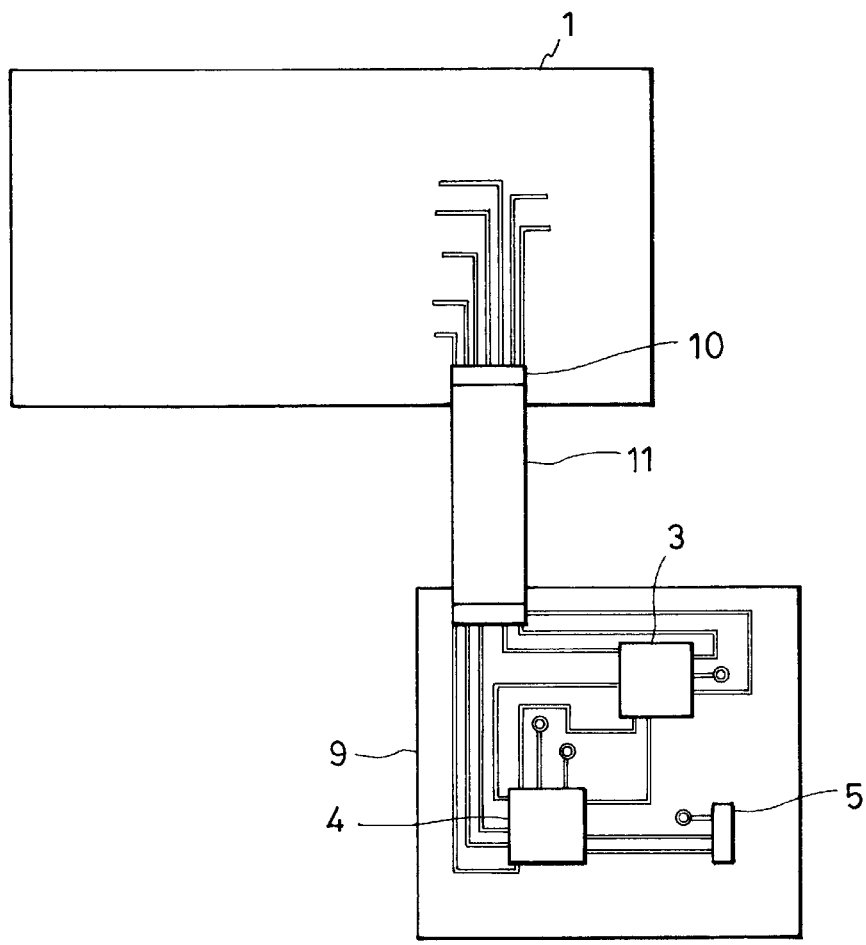
FIG. 6 is a top plan view showing a conventional example in which a power circuit and a digital circuit are formed on separate printed wiring boards.
Figure 7:
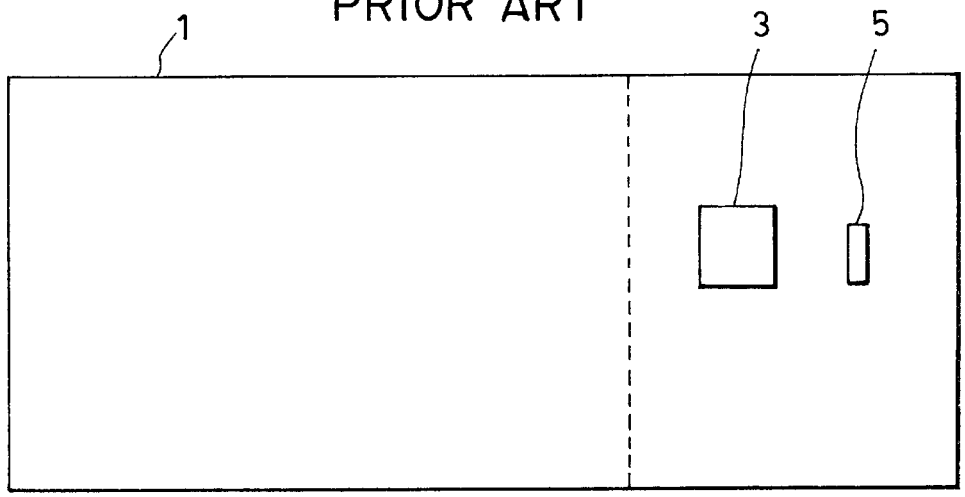
FIG. 7 is a top plan view showing a conventional example in which a power circuit and a digital circuit are formed on the same printed wiring board.

FIG. 1 is a top plan view which shows the features of a printed wiring board unit of a first embodiment of the present invention. Components in FIG. 1 which are the same as those shown in FIGS. 6 and 7 are given the same reference numerals.

The printed wiring board unit of this embodiment is used in an electronic apparatus comprising a digital circuit and a power circuit. As shown in FIG. 1, the printed wiring board unit comprises (i) a module which is a four-layer printed wiring board 2 on which is mounted a CPU 3 operating at the highest internal clock frequency from among the digital circuits used in an electronic apparatus, a gate array IC 4 which is a circuit having an integration density higher than an LSI and which is other than a memory, which inputs and outputs a high-speed signal, including a clock signal, in order to control the circuits peripheral to the CPU 3, and an IC of a dynamic memory (DRAM) 5 which inputs and outputs a signal into and from the CPU 3 and the gate array IC 4, and (ii) a printed wiring board 1, which is a single-sided board on which the module is mounted along with a power circuit. Reference numeral 12 in FIG. 4 denotes a lead pin which is provided in the printed wiring board 2 in order to mount it in a layered structure on the printed wiring board 1 and to make an electrical connection. In the printed wiring board 2, the pattern spacing of the wiring patterns is narrower than that of the printed wiring board 1 in order to achieve a high density, and the printed wiring board 2 itself is formed to be small.

The module in this case has a high degree of freedom of design because the four-layer printed wiring board 2 is used, and patterns which transmit high-frequency signals can be formed as short as possible. Normally, since a read only memory, etc., is not likely to become an unwanted source of radiation noise because such signals are not input or output frequently after being read once, it need not be contained in the module and may be mounted in either of the printed wiring board 1 or 2 as required.

The generation of unwanted radiation noise can be reduced considerably by forming a digital circuit block having a high frequency, which becomes an unwanted radiation noise source, into a module so as to be small in size and further, by mounting it onto the printed wiring board 1 mainly forming a power circuit without using a cable which becomes an antenna in the manner described above. Also, if the IC which is mounted onto the board of the module is mounted by bare-chip mounting or by using a chip-size package, a smaller module can be constructed, making it possible to further prevent the generation of unwanted radiation noise.

In this embodiment, the printed wiring board 1 is a single-sided board. In a normal case, when a single-sided board is used, it is difficult to form a continuous ground, and therefore, unwanted radiation noise is strongly generated. However, with the construction of the present invention, this noise can be suppressed. In the printed wiring boards 1 and 2, the components which are not directly related to the present invention are omitted without being particularly shown in the figures. The same applies for all the figures.

[Second Embodiment]

Figure 2:
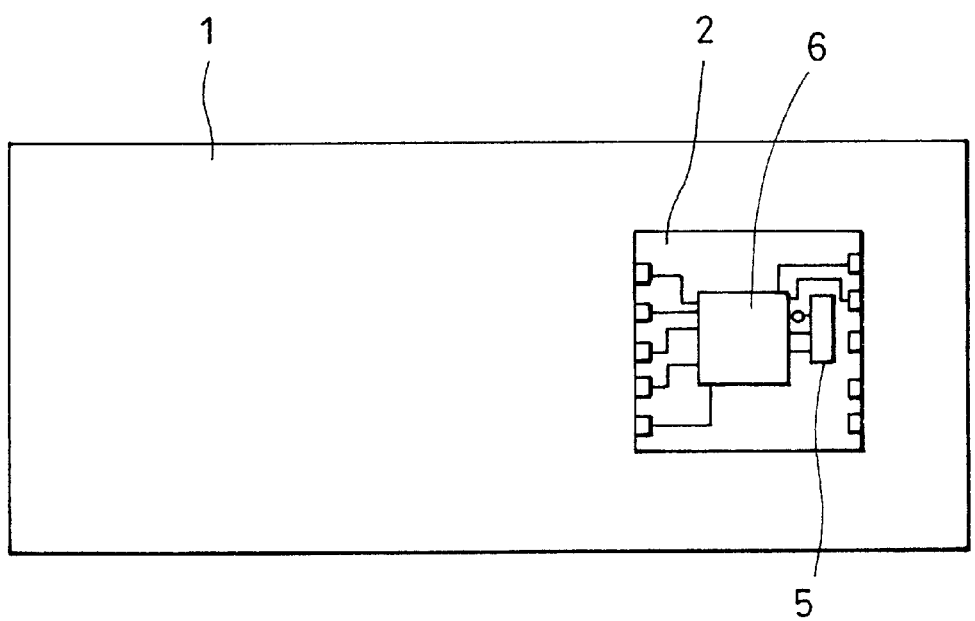
FIG. 2 is a top plan view of a printed wiring board unit according to a second embodiment of the present invention.

FIG. 2 is a top plan view showing the features of a printed wiring board of a second embodiment of the present invention. Components in FIG. 2 which are the same as those of the conventional example shown in FIGS. 6 and 7 are given the same reference numerals.

In this embodiment, an IC, forming a relatively simple digital circuit, which is a one-chip microcomputer 6 which operates at the highest internal clock frequency in the electronic apparatus, and a dynamic memory IC 5, are mounted onto the four-layer printed wiring board 2 so as to form a module. This module is mounted onto the printed wiring board 1, which is a single-sided board. Since a one-chip microcomputer 6 is used, the IC 4, which is an LSI which inputs and outputs signals into and from the CPU 3 as in the first embodiment, is not present in the printed wiring board 2. The remaining construction is the same as that of the first embodiment. That is, the ICs 3 and 4 are highly integrated, and the printed wiring board 2 is formed into an even smaller size.

[Third Embodiment]

Figure 3:
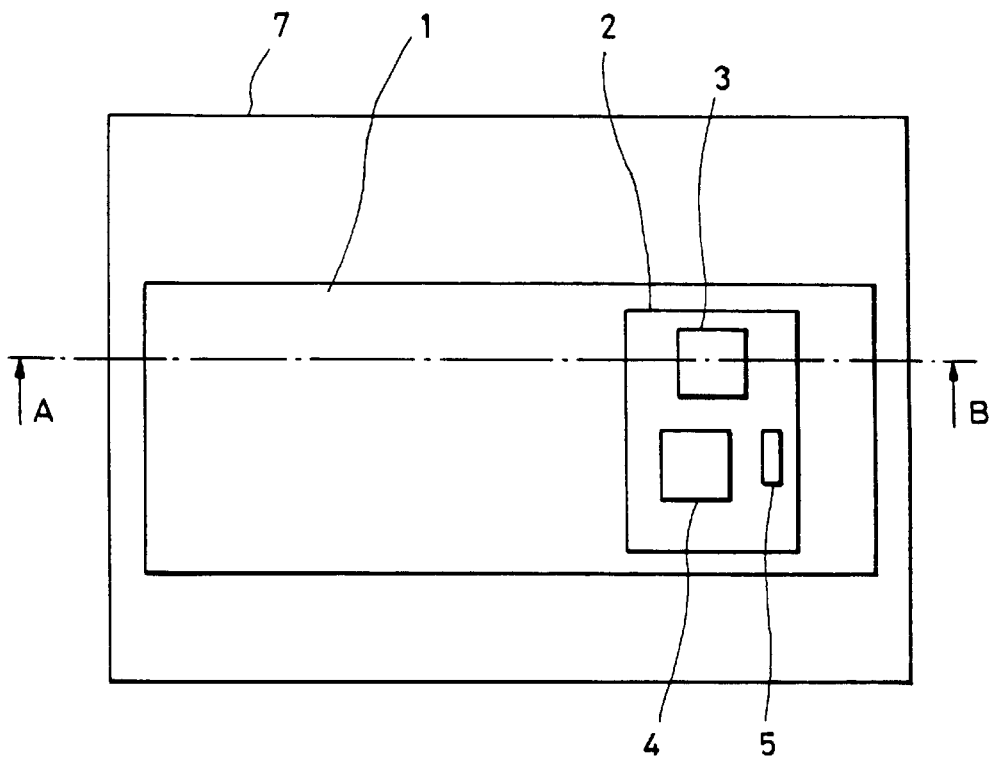
FIG. 3 is a top plan view of a printed wiring board unit according to a third embodiment of the present invention.

FIG. 3 is a top plan view showing the features of a printed wiring board of a third embodiment of the present invention. Components in FIG. 3 which are the same as those of the conventional example shown in FIGS. 6 and 7 are given the same reference numerals.

As shown in FIG. 3, the printed wiring board unit of this embodiment is constructed in such a way that a printed wiring board unit of the first embodiment is used such that a module having a digital circuit mounted onto the printed wiring board 2 is mounted onto the printed wiring board 1 which is a single-sided board and on which a power circuit and various sensor circuits are mainly formed. This printed wiring board unit of the first embodiment is disposed so that the printed wiring board 1 directly opposes a metal member 7 in a metal housing.

Figure 4:
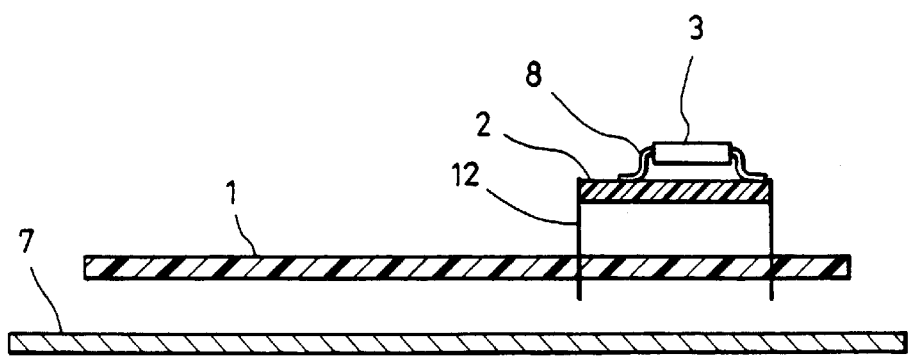
FIG. 4 is a sectional view taken along the line A–B of the printed wiring board unit shown in FIG. 3.

FIG. 4 shows a sectional view taken along the line A–B of FIG. 3 for the purpose of making it easy to understand the construction of the printed wiring board unit of this embodiment. The CPU 3 is connected to the four-layer printed wiring board 2 through a lead pin 8, and the four-layer printed wiring board 2 is further connected to the printed wiring board 1 through a lead pin 12. Furthermore, the metal member 7 made of a metal housing is disposed directly below the printed wiring board 1.

The metal plane-shaped member is disposed directly below the single-sided printed wiring board 1 in the manner described above, making it possible to further improve immunity to the unwanted radiation noise characteristics.

Figure 5:
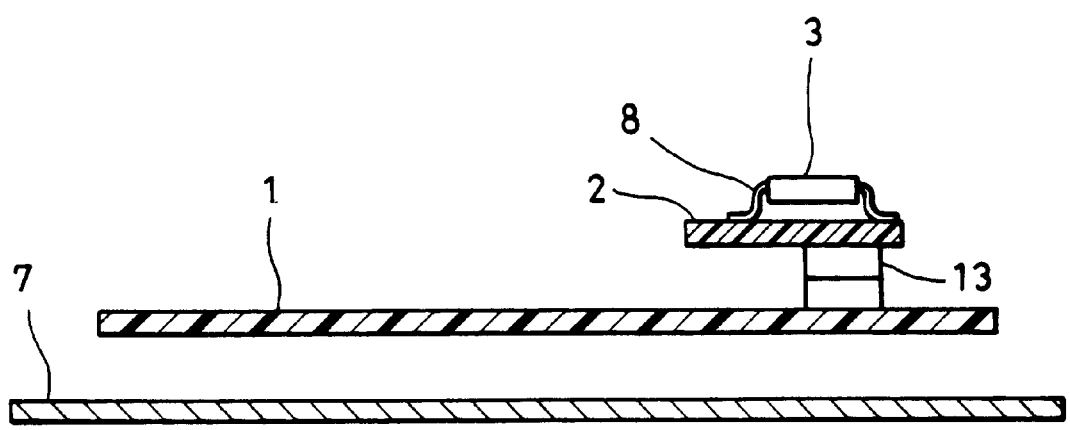
FIG. 5 is a sectional view showing another example of the printed wiring board unit shown in FIG. 4.

FIG. 5 shows another example of the printed wiring board shown in FIG. 4, in which the mounting of the printed wiring board 2 onto the printed wiring board 1 is performed by a connector 13 in place of the lead pin 12.

According to the present invention, an IC which operates at the highest internal clock frequency at least in the digital circuits used in an electronic apparatus, an IC, other than a memory, having an integration density higher than an LSI, which inputs and outputs signals into and from the IC which operates at the highest internal clock frequency, and a RAM which inputs and outputs signals into and from the ICs are formed into a module by using a printed wiring board of two or more layers, and a mounting structure is achieved such that the module is mounted on a printed wiring board including a power circuit and/or an analog circuit. Therefore, since cables, etc., need not be used, it is possible to greatly improve the unwanted radiation noise characteristics. That is, a digital circuit part, which is an unwanted radiation noise source, is formed into a module by using a high-density printed wiring board of two or more layers. The multi-layer board of four or more layers and the ICs are preferably formed as small as possible by using bare-chip mounting or a chip-size package.

In general, when unwanted radiation of a differential mode is considered, the electric-field intensity in the direction of the maximum unwanted radiation is expressed by equation (1) below ("Practical noise reduction technique", p.324, Jatec Publication).

$$E = 263 \times 10^{-16} \, (f^2 \cdot A \cdot I) \cdot (1/r) \quad \text{(equation 1)}$$

where E is the electric-field intensity [Volt/m], f is the frequency [Hz], A is the loop area [m²], I is the current [A], and r is the distance [m] to the receiving antenna. Based on equation 1 above, the loop area A of the high-frequency current I at which the unwanted radiation noise becomes a problem is preferably as small as possible. That is, the digital signal line is preferably as short as possible, and the ground pattern through which return current flows is preferably connected to the ground of an IC which outputs a signal, as close to a signal line as possible. Specifically, an IC operating at the highest internal clock frequency, which becomes the largest noise source in the digital circuit, an IC which inputs and outputs a high-speed signal including a clock, into and from the IC operating at the highest internal clock frequency, and a RAM which inputs and outputs a signal at a high speed into and from the ICs, are formed into a module so as to be as small as possible. As a result, the noise generation source can be suppressed as much as possible. Since a high-density board is used only for those circuit blocks that are necessary, the cost of this part is minimized.

Furthermore, since this module is directly mounted onto a printed wiring board including a power circuit board, a cable which acts as an antenna with high unwanted radiation efficiency is not used, making it possible to decrease the unwanted radiation noise level.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. A printed wiring board unit for use with an electronic apparatus formed of a power circuit, an analog circuit and a plurality of digital circuits which operate respectively at different frequencies said printed wiring board unit comprising:

a second printed wiring board which constitutes only digital circuits, said second printed wiring board having mounted thereon at least a first digital IC which operates at the highest internal clock frequency within said printed wiring board unit and a second digital IC which operates in synchronization with the first digital IC, and said ICs being formed into a module;

a first printed wiring board which constitutes a power circuit, an analog circuit, and a digital circuit which operates at a frequency differing from that of the digital circuit mounted on said second printed wiring board, said first printed wiring board being a single-sided board and being formed larger than said second printed wiring board; and means for permanently mounting said second printed wiring board onto said first printed wiring board in a layered structure.

2. A printed wiring board unit according to claim 1, wherein said second printed wiring board has further mounted thereon a random access memory RAM IC which inputs and outputs signals to and from said first and second ICs, said ICs being formed into a module.

3. A printed wiring board unit according to claim 2, wherein said ICs mounted on said second printed wiring board are mounted by bare-chip mounting or by using a chip-size package.

4. A printed wiring board unit for use with an electronic apparatus formed of a power circuit, an analog circuit and a plurality of digital circuits which operate respectively at different frequencies, said printed wiring board unit comprising:

a second printed wiring board which constitutes only digital circuits, the second printed wiring board being a multi-layer board of two or more layers and having mounted thereon at least a first digital IC which operates at the highest internal clock frequency within said printed wiring board unit and a second digital IC which operates in synchronization with the first digital IC, and said ICs being formed into a module;

a first printed wiring board which constitutes a power circuit, an analog circuit, and a digital circuit which operates at a frequency differing from that of the digital circuit mounted on said first printed wiring board, said first printed wiring board being a single-sided board and being formed larger than the second printed wiring board; and means for permanently mounting said second printed wiring board onto said first printed wiring board in a layered structure.

5. A printed wiring board unit according to claim 4, further comprising a plane-shaped metal member disposed at an opposing position to said first printed wiring board.

6. A printed wiring board unit for use with an electronic apparatus, said printed wiring board unit comprising:

a second printed wiring board which constitutes only a digital circuit, said second printed wiring board being a multi-layer board of two or more layers, having mounted thereon at least a first digital IC which operates at the highest internal clock frequency within said printed wiring board unit and a second digital IC which operates in synchronization with the first digital IC, and being highly integrated;

a first printing wiring board which constitutes a power circuit, an analog circuit, and a digital circuit which operates at a frequency differing from that of said digital circuits which are formed into a module, said first printed wiring board being a single-sided board and being formed larger than said second printed wiring board; and means for permanently mounting said second printed wiring board onto said first printed wiring board in a layered structure.

7. A printed wiring board unit for use with an electronic apparatus, said printed wiring board unit comprising:

a second printed wiring board which constitutes only a digital circuit, said second printed wiring board being formed at a higher density than the first printed wiring board, having mounted thereon at least a first digital IC which operates at the highest internal clock frequency at least a first digital IC which operates at the highest internal clock frequency within said printed wiring board unit and a second digital IC which operates in synchronization with the first digital IC, which are highly integrated;

a first printed wiring board which constitutes a power circuit, an analog circuit, and a digital circuit which is other than said digital circuits which are highly integrated, said first printed wiring board being a single-sided board and being formed larger than said second printed wiring board; and means for permanently mounting said second printed wiring board onto said first printed wiring board in a layered structure.

8. A printed wiring board unit according to claim 4, wherein said second printed wiring board is mounted onto said first printed wiring board through lead pins and electrically connected thereto.

9. A printed wiring board unit according to claim 4, wherein said second printed wiring board is mounted onto said first printed wiring board through a connector and electrically connected thereto.

10. A printed wiring board unit for use with an electronic apparatus, said printed wiring board unit comprising:

a second printed wiring board which constitutes only a digital circuit, the second printed wiring board being a multi-layer board of two or more layers, having mounted thereon an IC which operates at the highest internal clock frequency within said printed wiring board unit, and being highly integrated;

a first printed wiring board which constitutes a power circuit, an analog circuit, and a digital circuit which operates at a frequency differing from that of said digital circuit which is highly integrated, said first printed wiring board being a single-sided board and being formed larger than the second printed wiring board; and means for permanently mounting said second printed wiring board onto said first printed wiring board in a layered structure.

11. A printed wiring board unit for use with an electronic apparatus, said printed wiring board unit comprising:

a second printed wiring board which constitutes only a digital circuit, said second printed wiring board being formed at a higher density than the first printed wiring board, having mounted thereon at least a first digital IC which operates at the highest internal clock frequency within said printed wiring board unit and a second digital IC which operates in synchronization with the first digital IC, which are highly integrated;

a first printed wiring board which constitutes a power circuit, an analog circuit, and a digital circuit which operates at a frequency differing from that of said digital circuit which is highly integrated, said first printed wiring board being a single-sided board and being formed larger than the second printed wiring board; and means for permanently mounting said second printed wiring board onto said first printed wiring board in a layered structure.

\* \* \* \* \*